US010851768B2

(12) United States Patent
Malon et al.

(10) Patent No.: US 10,851,768 B2
(45) Date of Patent: Dec. 1, 2020

(54) ELECTRICAL GROUNDING ASSEMBLY ARRANGEMENT FOR RECIPROCATING COMPRESSOR

(71) Applicant: Embraco Industria De Compressores E Solucoes Em Refrigeracao Ltda., Joinville (BR)

(72) Inventors: Vagner Roberto Malon, Joinville (BR); Marcelo Alessandro Santos, Joinville (BR); Rafael Burg Rech, Joinville (BR)

(73) Assignee: Embraco Industria De Compressores E Solucoes Em Refrigeracao Ltda., Joinville (BR)

( * ) Notice: Subject to any disclaimer, the term of this patent is extended or adjusted under 35 U.S.C. 154(b) by 0 days.

(21) Appl. No.: 16/695,501

(22) Filed: Nov. 26, 2019

(65) Prior Publication Data

US 2020/0173432 A1 Jun. 4, 2020

(30) Foreign Application Priority Data

Nov. 29, 2018 (BR) ............................ 102018074738

(51) Int. Cl.
*H05K 1/14* (2006.01)
*F04B 39/12* (2006.01)
(Continued)

(52) U.S. Cl.
CPC ............ *F04B 39/121* (2013.01); *H01R 4/34* (2013.01); *F04B 35/04* (2013.01)

(58) Field of Classification Search
CPC ........ H05K 1/144; H05K 1/053; H05K 7/142; H01L 23/4093; H01L 2224/73253;
(Continued)

(56) References Cited

U.S. PATENT DOCUMENTS

| | | | | |
|---|---|---|---|---|
| 7,322,595 B2 * | 1/2008 | Wallentin | B60R 21/2171 280/728.2 |
| 7,481,447 B2 * | 1/2009 | Stevens | B60R 21/26 280/728.2 |

(Continued)

FOREIGN PATENT DOCUMENTS

| | | | |
|---|---|---|---|
| CN | 1254798 A | 5/2000 |
| CN | 203594576 U | 5/2014 |
| EP | 0 793 068 A1 | 9/1997 |

*Primary Examiner* — Phuong Chi Thi Nguyen
(74) *Attorney, Agent, or Firm* — Harrington & Smith

(57) ABSTRACT

Is disclosed an electrical grounding assembly arrangement for reciprocating compressor capable of optimizing the assembly of the electrical grounding connection and allows a quick visual inspection of the same, while providing a saving of electrical conductors, which are nonexistent in light of the invention in question. For this purpose, the casing (of the frequency inverter, which is fixed to the external region of the compressor housing) includes an electrical grounding bus capable of receiving, on its external portion, a fixing metal element specially adapted to electrically connect the outer portion of the electrical grounding bus and the electrical grounding connection of the housing and, at the same time, mechanically fixing the casing to the reciprocating compressor housing by physically locking the external portion of the electrical grounding bus and the electrical grounding connection of the housing.

4 Claims, 3 Drawing Sheets

(51) Int. Cl.
*H01R 4/34* (2006.01)
*F04B 35/04* (2006.01)

(58) Field of Classification Search
CPC . H01L 2924/01079; H01L 2924/15311; H01L 2224/48091; G06F 1/181
USPC ............... 361/736, 706, 704, 705, 730, 752; 257/706, 707, 720, 724
See application file for complete search history.

(56) References Cited

U.S. PATENT DOCUMENTS 7,510,211 B2 * 3/2009 Clark ...................... F42B 3/103 102/530
7,614,875 B2 * 11/2009 Katsuda .................. B60R 21/26 280/728.1

* cited by examiner

ELECTRICAL GROUNDING ASSEMBLY ARRANGEMENT FOR RECIPROCATING COMPRESSOR

FIELD OF THE INVENTION

The present invention relates to an electrical grounding assembly arrangement for reciprocating compressor, which is especially adapted for reciprocating compressors comprising at least one external frequency inverter coupled to the housing of said reciprocating compressor.

Generally speaking, the electrical grounding assembly arrangement for reciprocating compressor disclosed herein optimizes the assembly of the electrical grounding connection and enables rapid visual inspection of the same, as well as providing savings on electrical conductors, which are nonexistent in light of the invention in question.

BACKGROUND OF THE INVENTION

As is well known to those skilled in the art, variable speed reciprocating compressors, all of which are operated by the actuation of an electric motor disposed within the hermetic housing, comprise, among a multitude of components and functional systems, at least one external frequency inverter specially mounted in a casing capable of being secured to the housing of said reciprocating compressor and at least one grounding point also disposed in the external region of the housing of the reciprocating compressor. Normally, the grounding point and the electrical terminals to which the external frequency inverter is connected are arranged in close proximity.

In a purely conventional scenario, the electrical grounding means and the external frequency inverter are disassociated from each other, and eventually the electrical grounding conductor, which is electrically associated with the grounding point of the compressor housing and to the grounding point of the electrical power supply may also be arranged, without any kind of electrical connection to the frequency inverter circuit (normally a printed circuit) within the interior of the casing in which the external frequency inverter is housed.

In any case, the assembly of the external frequency inverter and the compressor grounding is usually performed from at least four purely manual steps. In a first step, the operator connects the electrical terminals of the external frequency inverter to the electrical terminals of the compressor housing (which are a mere extension of the electric motor terminals disposed within the hermetic compressor housing). In a second step, the operator couples the electrical terminal of the grounding electrical conductor (normally designed from the external frequency inverter casing) to the grounding point disposed on the outside of the reciprocating compressor housing. In a third step, the operator couples the casing to the compressor housing, so that the connections and terminals are no longer exposed to human contact. In a fourth step, the operator performs mechanical fixing between certain structural points of the casing and certain structural points of the compressor housing.

In this type of operation, it is not uncommon for the operator to forget to perform the second step, which ultimately results in the electrical non-grounding of the reciprocating compressor. Moreover, in case the non-execution of the second step is verified, it is observed that the execution of the same requires, in a preliminary way, the mechanical disassociation between the casing and the compressor housing.

In contrast, the current state of the art is integrated by solutions in which the housing itself that houses the external frequency inverter comprises a grounding terminal. In these solutions, the electrical connection between the electrical terminals of the external frequency inverter and the electrical terminals of the compressor housing and the electrical connection between the grounding terminal and the grounding point disposed on the external region of the reciprocating compressor housing occur at the same time, in the same assembly step. Examples of these solutions can be found in patent documents CN1254798, EP0793068 and CN203594576.

However, although the solutions described and illustrated in these patent documents address the need for additional assembly of the compressor electrical grounding means, it is verified that they still require an electrical connection assembly step and, subsequently, a mechanical fixing. That is, two distinct steps are still required, which can be interpreted as a manufacturing drawback.

It is based on this scenario that the invention in question arises.

GOALS OF THE INVENTION

Thus, the present invention has as its main goal to present an electrical grounding assembly arrangement for reciprocating compressor fully linked to the casing that houses the external frequency inverter, being the electrical connection (between the grounding terminal and the grounding point of the external region of the compressor housing) and the mechanical fixing (between the casing that houses the external frequency inverter and the compressor housing) performed at the same time.

In addition, it is also a goal of the invention in question to provide an electrical grounding assembly arrangement for reciprocating compressor, whose electrical grounding itself is not carried out by electrical conductor cables, but by metal buses already incorporated in the housing that houses the external frequency inverter.

BRIEF DESCRIPTION OF THE FIGURES

The preferred embodiment of the invention in question is described in detail based on the listed figures, which.

DETAILED DESCRIPTION OF THE INVENTION

As illustrated in the figures, it is disclosed an electrical grounding assembly arrangement for reciprocating compressor specially developed to abolish any type of electrical conductor cable for electrical grounding, as well as optimizing the assembly and fixing of the casing that houses the frequency inverter to the reciprocating compressor housing, being the fixing between both made by the electrical grounding connection.

Figure 1:
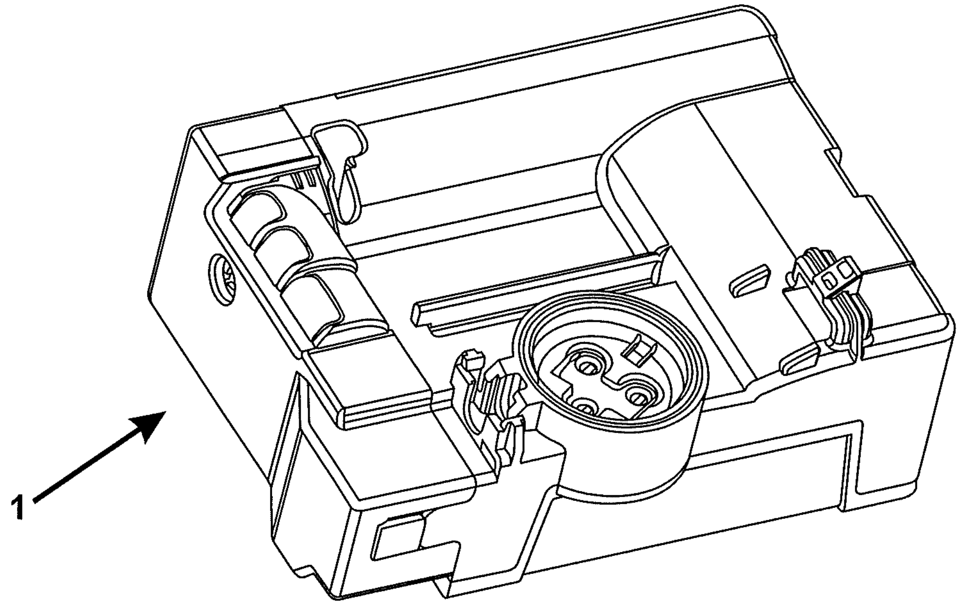
FIG. 1 illustrates, in perspective, a possible embodiment of the casing that houses the frequency inverter.
Figure 2:
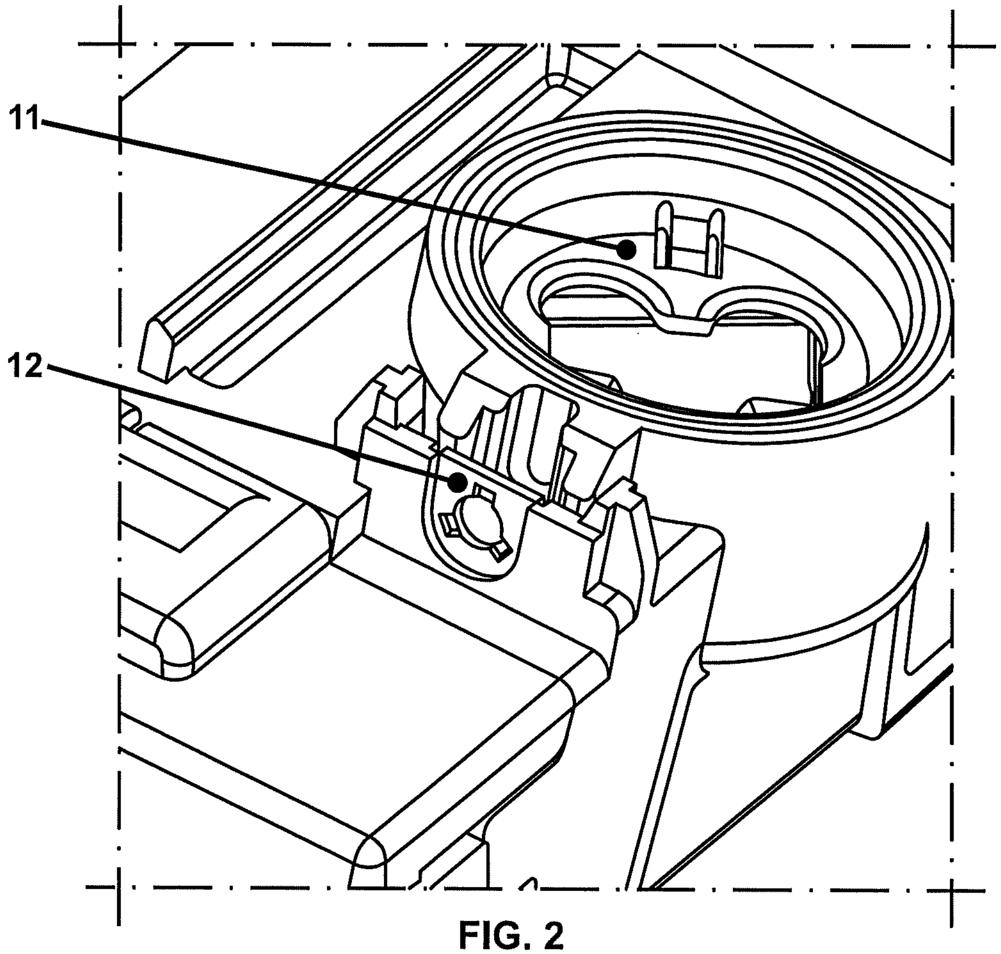
FIG. 2 illustrates, in enlarged detail, details of FIG. 1.
Figure 3:
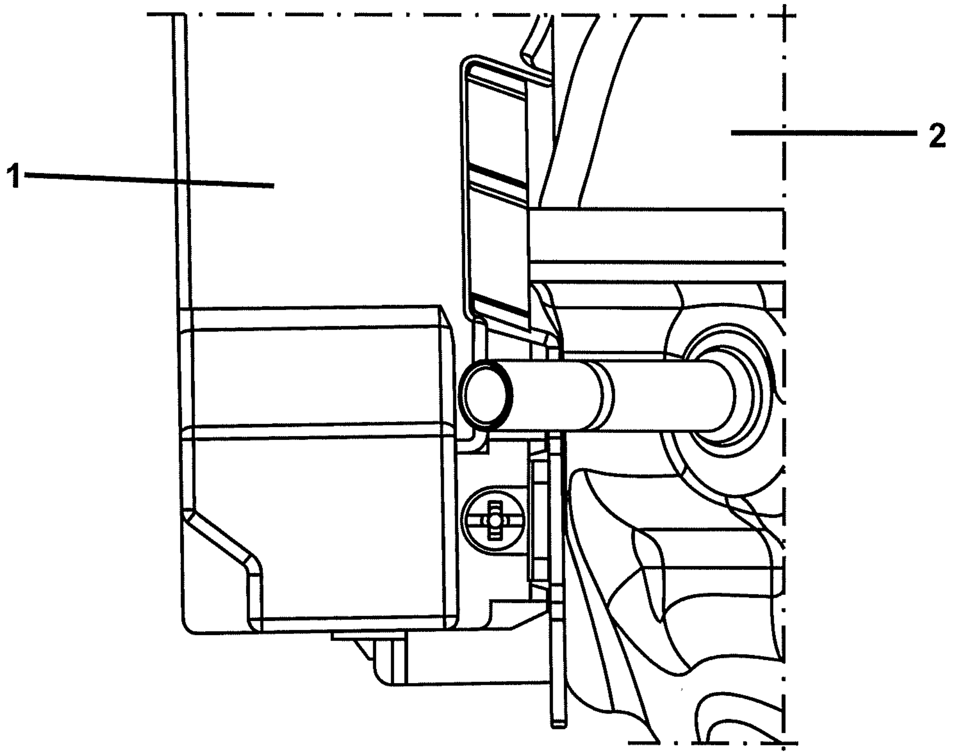
FIGS. 3, 4, 5 and 6 illustrate, in schematic detail, the coupling between the casing that houses the frequency inverter and the reciprocating compressor housing.

FIGS. 1 and 2 illustrate a possible embodiment of casing 1 that houses the frequency inverter.

Such as occur with counterpart casings belonging to the current state of the art, said casing 1 is specially adapted to house, inside it, a frequency inverter (not shown) intended for the control and electrical supply of the electric motor (not shown) arranged inside the reciprocating compressor housing 2. In this sense, and in a fundamentally trivial manner, said casing 1 comprises an opening 11 through which the frequency inverter is electrically connected to the electrical terminals (not particularly illustrated) which, disposed in the external area of the reciprocating compressor housing 2, have electrical connection with the aforementioned electric motor arranged inside the reciprocating compressor housing 2.

In addition, as also seen in the state of the art, the reciprocating compressor comprises an electrical grounding connection 21 disposed on the outer face of the housing 2. Preferably, but not limited to, the electrical grounding connection 21 is mechanical and electrically associated with a metal plate which, welded to the outer face of the compressor housing, is dedicated to the reception of the casing 1.

Figure 4:
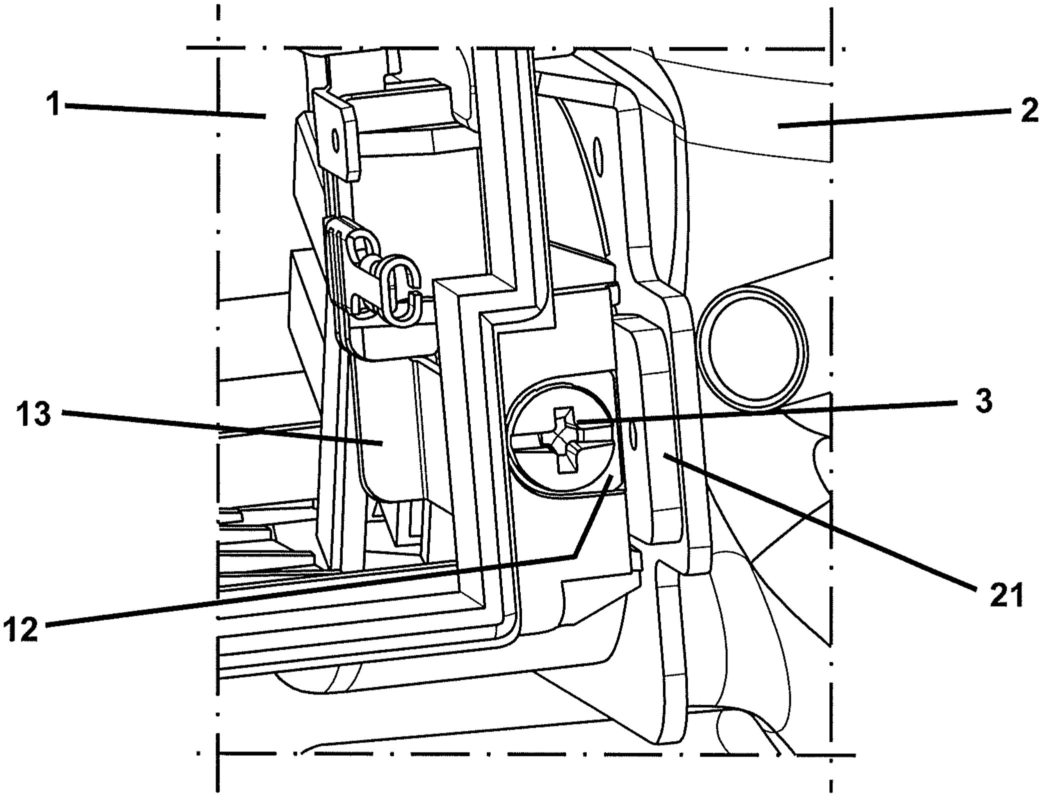
Figure 5:
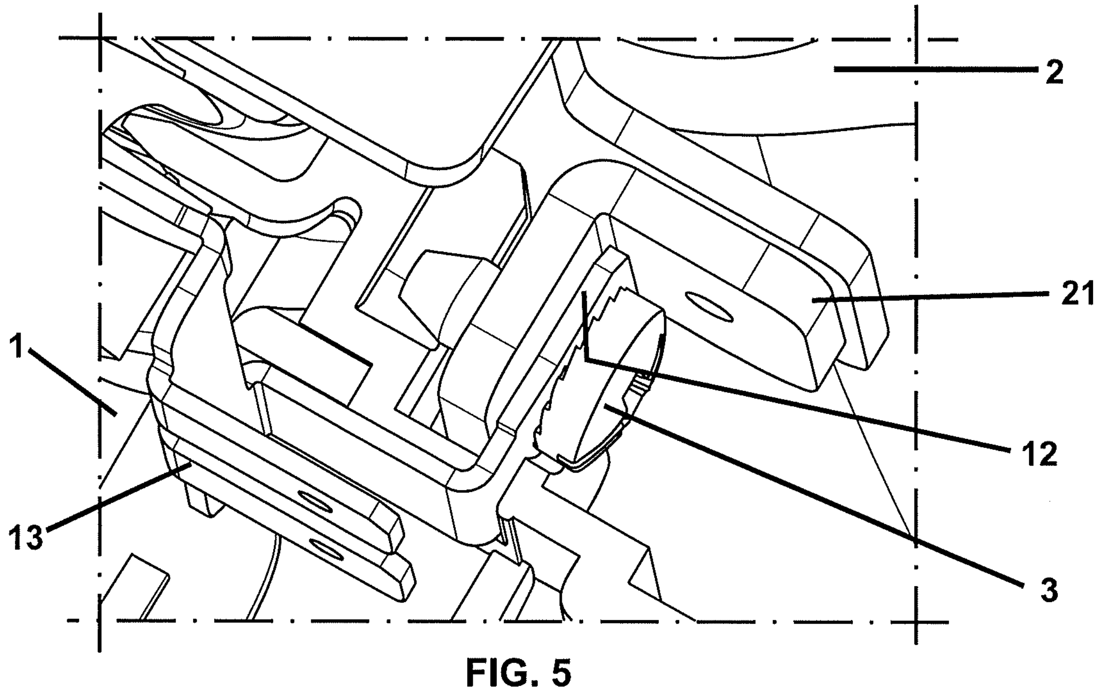
Figure 6:
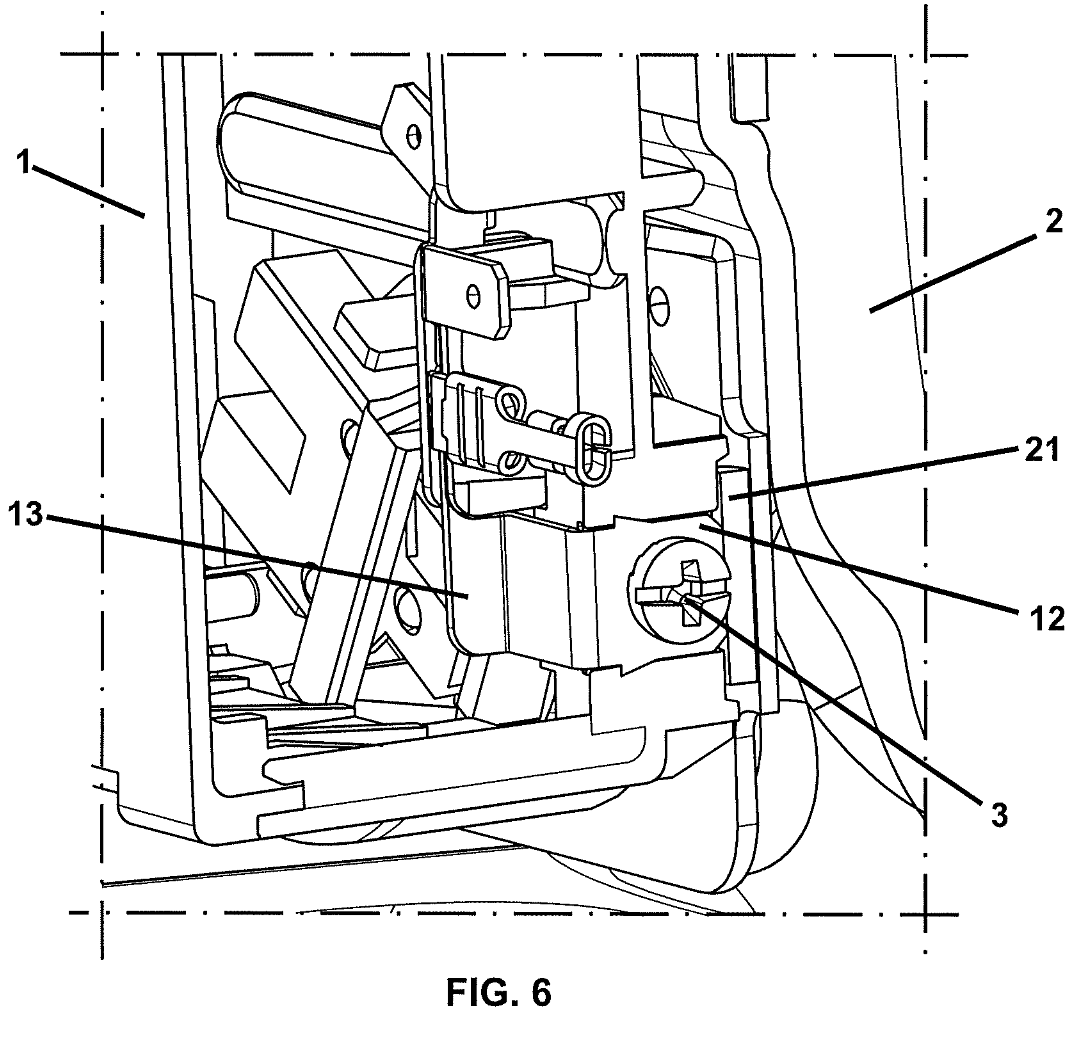

Unlike in the present state of the art, casing 1 comprises a structure capable of retaining an electrical grounding bus in a fixed and stable position. In this position, as best illustrated in FIGS. 4 and 5, said electrical grounding bus retained within the casing 1 is integrated by an outer portion 12 and an inner portion 13, wherein the outer portion 12 of the electrical grounding bus is specially adapted to cooperate with the electrical grounding connection 21 of the housing 2 by means of a fixing metal element 3, the inner portion 13 of the electrical grounding bus is specially adapted to cooperate with the electrical grounding circuit (not shown) of the equipment on which the compressor is installed (for example, refrigerant grounding electric circuit), which is electrically connected to the grounding medium of the electrical power supply network (not shown).

Preferably, the outer portion 12 of the grounding bus and the grounding electrical connection 21 of the housing 2 comprise metal plates of similar size and shape, with both the outer portion 12 of the grounding bus and the electrical grounding connection 21 of the housing 2 comprise at least one through hole capable of receiving the fixing metal element 3.

In this context, according to the invention in question, the fixing metal element 3, preferably a screw or equivalent, is adapted to electrically connect the external portion 12 of the electrical grounding bus and the electrical grounding connection 21 of the housing 2 and, at the same time, mechanically fixing the casing 1 to the reciprocating compressor housing 2 by physically locking the outer portion 12 of the electrical grounding bus and the electrical grounding connection 21 of the housing 2.

This means that the fixation maintenance of casing 1 in the reciprocating compressor housing 2 is maintained by the fixing metal element 3. Therefore, all the goals of the invention in question are achieved.

It is important to emphasize that the above description is intended solely to exemplarily describe the particular embodiment of the invention in question. Therefore, it is clear that modifications, variations and constructive combinations of the elements that perform the same function, in substantially the same way, to achieve the same results, remain within the scope of protection delimited by the appended claims.

The invention claimed is:

1. Electrical grounding assembly arrangement for reciprocating compressor, comprising:

at least one casing capable of housing, inside the same, at least one frequency inverter;

at least one electrical grounding connection disposed on the outer face of the reciprocating compressor housing;

said electrical grounding assembly arrangement for reciprocating compressor being especially characterized by the fact that:

the casing comprises at least one electrical grounding bus integrated by an outer portion and an inner portion;

said outer portion of the electrical grounding bus is specially adapted to cooperate with the electrical grounding connection of the housing by means for having a fixing metal element;

said inner portion of the electrical grounding bus is specially adapted to cooperate with the complementary electrical grounding circuit and linked to the grounding of the electric power supply network;

said fixing metal element being adapted to electrically connect the outer portion of the electrical grounding bus and the electrical grounding connection of the housing and, mechanically fixing the casing to the reciprocating compressor housing by physical locking between the outer portion of the electrical grounding bus and the electrical grounding connection of the housing.

2. Arrangement, according to claim 1, characterized by the fact that the external portion of the grounding bus and the electrical grounding connection of the housing comprise metal plates of similar shape and size, being that both the outer portion of the grounding bus and the electrical grounding connection of the housing comprise at least one through hole capable of receiving the fixing metal element.

3. Arrangement, according to claim 1, characterized by the fact that the maintenance of the housing fixation in the reciprocating compressor housing by performed by the fixing metal element.

4. Arrangement, according to claim 1, characterized by the fact that the casing comprises a structure capable of holding the electrical grounding bus in a fixed and stable position.

* * * * *